United States Patent [19]

Hirose

[11] Patent Number: 4,460,879

[45] Date of Patent: Jul. 17, 1984

[54] VARIABLE TUNING DEVICE

[75] Inventor: Masaaki Hirose, Gyoda, Japan

[73] Assignee: Takeda Riken Kogyo Kabushiki Kaisha, Tokyo, Japan

[21] Appl. No.: 327,473

[22] Filed: Dec. 4, 1981

[30] Foreign Application Priority Data

Dec. 12, 1980 [JP] Japan .................................. 55-175494
Dec. 17, 1980 [JP] Japan .................................. 55-178207

[51] Int. Cl.³ .......................... H03H 7/01; H01P 1/20; H01P 1/217
[52] U.S. Cl. ...................................... 333/174; 333/1.1; 333/109; 333/176; 333/205; 333/223
[58] Field of Search ................ 333/1.1, 109, 110, 171, 333/175, 176, 202, 204, 170, 174, 169, 205, 223

[56] References Cited

U.S. PATENT DOCUMENTS 3,768,045 10/1973 Chung .............................. 333/1.1 X
3,781,704 12/1973 DeGruyl ........................... 333/1.1 X

FOREIGN PATENT DOCUMENTS 2046502  3/1972 Fed. Rep. of Germany ....... 333/1.1
2423457 11/1975 Fed. Rep. of Germany ....... 333/1.1
2442296  3/1976 Fed. Rep. of Germany ....... 333/1.1

Primary Examiner—Paul L. Gensler

[57] ABSTRACT

An input signal is supplied to a first port of a non-reversible circuit and those frequency components of the input signal applied to a second port of the non-reversible circuit which differ from the resonance frequency of a resonance element connected to the second port are absorbed by a resistive terminating element connected to the second port. On the other hand, a frequency component of the input signal which coincides with the resonance frequency is derived at the third port of the non-reversible circuit. By changing the resonance frequency of the resonance element, the frequency component of the input signal which are provided to the third port can be altered.

12 Claims, 11 Drawing Figures

FIG. 1

PRIOR ART

FIG. 2

PRIOR ART

VARIABLE TUNING DEVICE

BACKGROUND OF THE INVENTION

The present invention relates to a variable tuning device which is used, for example, as a first stage preselector of a spectrum analyzer to select a desired frequency component from an input signal and which permits changing of the frequency component to be selected.

One variable tuning device that has heretofore been used in an ultrahigh-frequency region above 500 MHz is one that employs a magnetic resonance element such as a YIG element. The variable tuning device using such a magnetic resonance element has high Q and is excellent in its selectivity characteristic. In the conventional variable tuning device employing the magnetic resonance element, a driving coil for receiving an input signal and an output coil for taking out an output signal are magnetically coupled with the magnetic resonance element and these coils are disposed to perpendicularly intersect with each other in such a manner that they are not directly coupled with each other. The magnetic resonance element is extremely small in diameter, for instance, approximately 0.66 mm, and the variable tuning device must be arranged so that the driving coil and the output coil are sufficiently coupled with the magnetic resonance element but so that the coils are not directly coupled with each other. Therefore, the prior art variable tuning device is very difficult to manufacture.

A variable band-pass filter has heretofore been used as a variable tuning device for selecting desired frequency components from signals of a frequency band lower than 500 MHz. In this variable tuning device, its input/output impedance must be held constant regardless of variations in the tuning frequency or the selecting frequency, so that it is necessary to simultaneously change the constants of a plurality of elements forming the filter when changing the tuning frequency. This requires a complex arrangement and introduces difficulty in changing the tuning frequency over a wide frequency band.

SUMMARY OF THE INVENTION

It is therefore an object of the present invention to provide a variable tuning device which exhibits a very excellent selectivity characteristic in both high and low frequency bands but is simple in construction and easy to manufacture.

Another object of the present invention is to provide a variable tuning device which is simple in construction and permits changing of its tuning frequency over a relatively wide frequency band.

According to the present invention, a non-reversible circuit is employed which is of the type providing an input signal from a first port to a second port and an input signal from the second port to a third port. An input terminal is connected to the first port of the non-reversible circuit, a resonance element capable of changing its resonance frequency is coupled with the second port and, further, a resistive terminating element is connected to the second port. With such an arrangement, a signal applied to the first port is supplied to the second port and frequency components of the signal which are different from the resonance frequency of the resonance element are absorbed by the resistive terminating element and do not appear at the third port, but a frequency component which coincides with the resonance frequency of the resonance element is reflected by the resonance element and derived at the third port. By changing the resonance frequency of the resonance element, it is possible to change the frequency component of the signal which is selected from the input signal at the first port and provided to the third port. In this way, the input impedance of the first port and the output impedance of the third port can be held unchanged regardless of a change in the resonance frequency of the resonance element. In addition, the variable tuning device of the present invention is simple in construction and easy to fabricate.

A directional bridge composed of resistors, a circulator, a directonal coupler or the like is used as the non-reversible circuit. The resonance element may be a magnetic resonance element, a variable parallel resonance circuit, a variable series resonance circuit or the like.

DETAILED DESCRIPTION OF THE PREFERRED EMBODIMENTS

Figure 1:
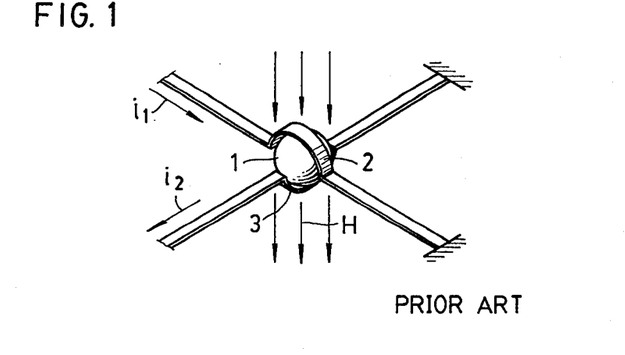
FIG. 1 is a perspective view showing the basic construction of a conventional variable tuning device.

To facilitate a better understanding of the present invention, a description will be given first of a conventional variable tuning device. FIG. 1 shows the construction of a prior art ultrahigh-frequency variable tuning device, which is disclosed, for example, in U.S. Pat. No. 3,973,204 entitled "YIG Tuned Mixer". A driving coil 2 and an output coil 3 are coupled with a YIG magnetic resonance element 1. The driving coil 2 and the output coil 3 are disposed to intersect each other at right angles and the magnetic resonance element 1 is disposed at their intersection. A magnetic field H is applied to the magnetic resonance element 1. Since the driving coil 2 and the output coil 3 are disposed to perpendicularly intersect, they are not magnetically coupled directly with each other. When the frequency of a current $i_1$ flowing in the driving coil 2 coincides with the resonance frequency of the magnetic resonance element 1, however, the magnetic resonance element 1 resonates by the current $i_1$ flowing in the driving coil 2, inducing in the output coil 3 a current $i_2$ of the same frequency as the resonance frequency of the magnetic resonance element 1. By changing the magnetic field H applied to the magnetic resonance element 1, its resonance frequency rises in proportion to the magnetic field H.

Figure 2:
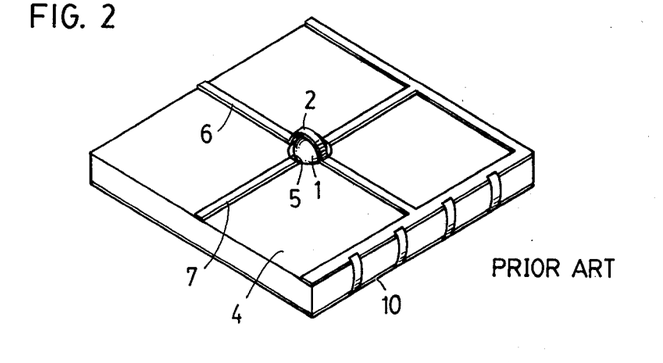
FIG. 2 is a perspective view showing a specific structure of the conventional variable tuning device.

The device of FIG. 1 is fabricated on an insulating plate 4 as shown in FIG. 2. The insulating plate 4 has formed therein a hole 5, in which the magnetic resonance element 1 is placed. Two strip lines are formed to perpendicularly intersect each other at the hole 5 and the coils 2 and 3 are inserted into the strip lines 6 and 7 for connection therewith at the position where the strip lines 6 and 7 cross the hole 5. The strip lines 6 and 7 are connected at one end to a grounding conductor 10. Thus the conventional tuning device has a cubic structure in which the driving coil 2 and the output coil 3 are each oppositely disposed with respect to the insulating plate 4 because they must be arranged to perpendicularly intersect each other across the hole 5 as described above. In addition, the diameter of the magnetic resonance element 1 is as small as 0.66 mm or so. Since the coils 2 and 3 must be disposed to extend along the spherical surface of the magnetic resonance element 1, a high degree of accuracy is needed in the manufacture of this tuning device. Furthermore, the magnetic resonance element 1 must be disposed so that the direction of its crystal axis bears specific relationships to the coils 2 and 3. Accordingly, it is difficult to adjust their positional interrelations, also introducing difficulties in the manufacture of the device.

Figure 3:
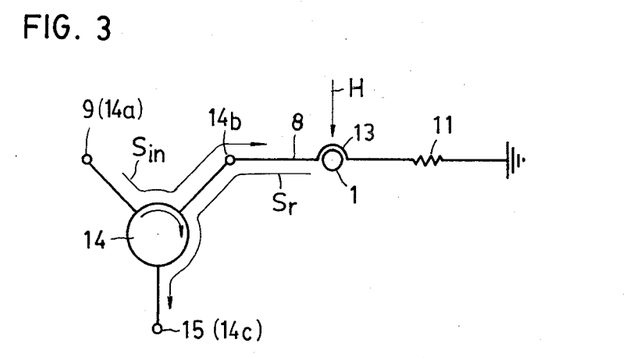
FIG. 3 is a circuit diagram illustrating an embodiment of the variable tuning device of the present invention which employs a circulator as the non-reversible circuit and a magnetic resonance element as the resonance element.

FIG. 3 illustrates an embodiment of the variable tuning device of the present invention. In this embodiment, a circulator 14 is employed as a non-reversible circuit. The circulator 14 has first, second and third ports 14a, 14b and 14c, and an input signal that is inputted from the first port 14a is outputted to the second port 14b, while an input signal to the second port 14b is outputted to the third port 14c. The first port 14a is used as an input terminal 9 and the third port 14c an output terminal 15. To the second port 14b is connected one end of a signal path 8, the other end of which is connected to a resistor 11 which has the same impedance as the characteristic impedance of the signal path 8 and serves as a resistive terminating element. A coil 13 is inserted in series in the signal path 8 between the second port 14b and the resistor 11 to couple the magnetic resonance element 1 with the coil 13. The magnetic field H is applied to the magnetic resonance element 1.

In the arrangement of FIG. 3, a signal Sin applied to the input terminal 9 appears at the second port 14b of the circulator 14. Signals of frequencies other than the resonance frequency of the magnetic resonance element 1 flow through the coil 13 from the second port 14b and are absorbed by the resistive terminating element 11. With respect to a signal having the same frequency as the resonance frequency of the magnetic resonance element 1, the effect of the impedance of the coil 13 is equivalent to shorting of the circuit to ground. In consequence, that one of the signals appearing at the second port 14b which has the same frequency as the resonance frequency of the magnetic resonance element 1 is reflected by the coil 13 back to the second port 14b and this reflected wave Sr is outputted from the third port 14c of the circulator 14, that is, to the output terminal 15.

Accordingly, the frequency characteristic between the input terminal 9 and the output terminal 15 becomes a band-pass characteristic having the same frequency characteristic as the resonance characteristic of the magnetic resonance element 1, that is, what is called a selective resonance characteristic. By changing the magnetic field H applied to the magnetic resonance element 1, the center frequency of the selective resonance characteristic can be varied. The center frequency of the resonance characteristic can be frequency swept by controlling, with a sawtooth wave, a magnetic field which is generated by magnetic field generating means (not shown).

Figure 4:
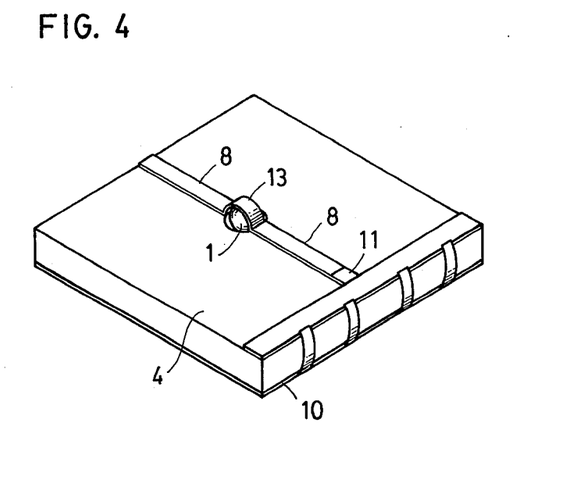
FIG. 4 is a perspective view showing a specific example of the surrounding construction of the magnetic resonance element in the variable tuning device depicted in FIG. 3.

As described above, according to the present invention, it is sufficient merely to couple the magnetic resonance element 1 with one signal path 8 alone. Especially, the purpose can be accomplished by coupling one coil 13 with the magnetic resonance element 1 as shown in FIG. 4. Hence the device of the present invention is simple in construction and easy to manufacture. In addition, the resistive terminating element can also be formed by, for example, screen printing techniques on the insulating plate 4. Therefore, the surrounding structures of the magnetic resonance element 1 can be simplified, allowing ease in the fabrication of the device.

Figure 5:
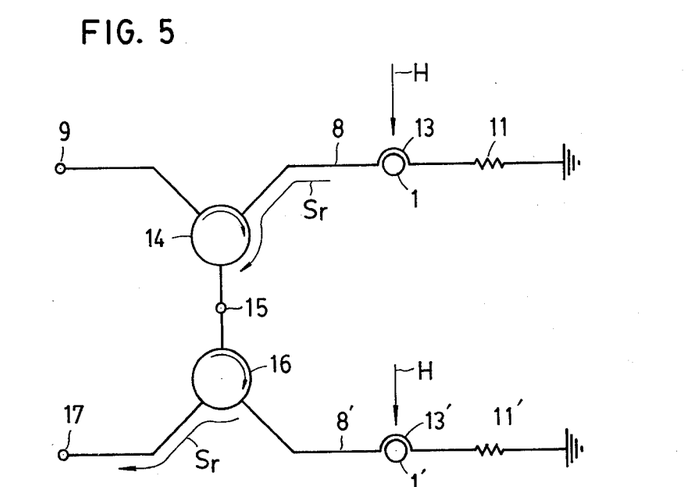
FIG. 5 is a circuit diagram illustrating an example of a cascade-connection of the variable tuning devices of the present invention.

FIG. 5 illustrates an example in which such variable tuning devices of the present invention as described above in FIG. 3 are cascade-connected with a view to improving the selectivity characteristic or the so-called Q. An output derived at the output terminal 15 of a first stage variable tuning device is supplied to the first port of a circulator 16 of a second stage and a signal appearing at the second port of the circulator 16 is provided to a second magnetic resonance element 1' connected to the second port. The same signal frequency component as the resonance frequency of the second magnetic resonance element 1' is provided to an output terminal 17 via the third port of the second circulator 16. Accordingly, by making the resonance frequencies of the magnetic resonance elements 1 and 1' of the first and second stages coincident with each other, a signal selected by the first stage magnetic resonance element 1 is further selected by the second stage magnetic resonance element 1', provided a steep selectivity characteristic as a whole. While this example employs the two-stage cascade connection of variable tuning devices, it will easily be understood that an increase in the number of stages of such a cascade connection will increase the Q of the variable tuning device assembly. In FIG. 5, a signal path 8', a resistive terminating element 11' and a coil 13' correspond to the signal path 8, the resistive terminating element 11 and the coil 13, respectively.

Figure 6:
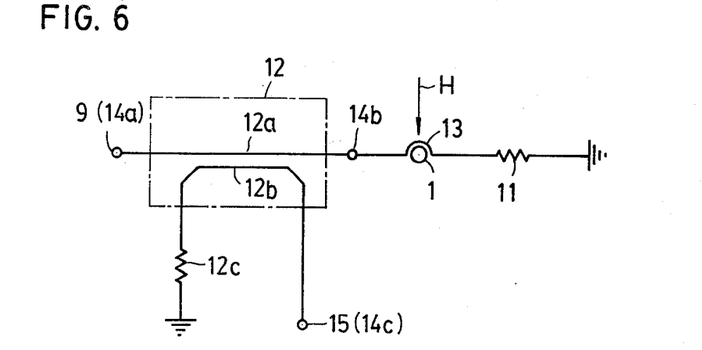
FIG. 6 is a circuit diagram illustrating another embodiment of the present invention which employs a directional coupler as the non-reversible circuit and a magnetic resonance element as the resonance element.

FIG. 6 illustrates another embodiment of the present invention, which employs a directional coupler 12 as the non-reversible circuit. The directional coupler 12 comprises a line 12a connected between the first and second ports 14a and 14b, a line 12b coupled with the line 12a and a terminating resistance element 12c connected to the line 12b on the side of the first port 14a, the portion of the line 12b on the side of the second port 14b serving as the third port 14c. With the use of such a directional coupler 12, it is also possible to obtain the same selecting resonance characteristic as that obtainable with the resonance characteristic of the magnetic resonance element 1. Since the directional coupler 12 is simple in construction as compared with the aforesaid circulator 14, the overall structure of the variable tuning device can further be simplified. By using such a directional coupler as set forth, for example, in "Stepped Coupling Symmetric 90-Degree Coupler", Microwave Engineer's Handbook, Artech House, 1971, Vol. 2, pp 3, the variable tuning device can be operated over a wide band.

Figure 7:
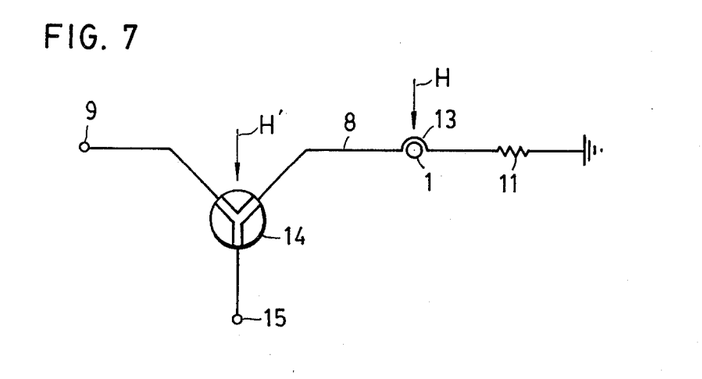
FIG. 7 is a circuit diagram illustrating a modified form of the embodiment of FIG. 3 in which the circulator 14 is a variable magnetic field type.

For wide-band operation through the use of the circulator 14 as the non-reversible circuit, a variable bias type circulator 14 is employed as shown in FIG. 7, for example. As is well known in the art, the variable bias type circulator 14 is formed of a material including a magnetic substance and has such a characteristic that its working center frequency varies with a bias magnetic field H' applied to the circulator. Accordingly, it is possible to cover a very wide frequency range by simultaneously changing the magnetic field H applied to the magnetic resonance element 1 and the bias magnetic field H' applied to the variable bias type circulator 14.

Figure 8:
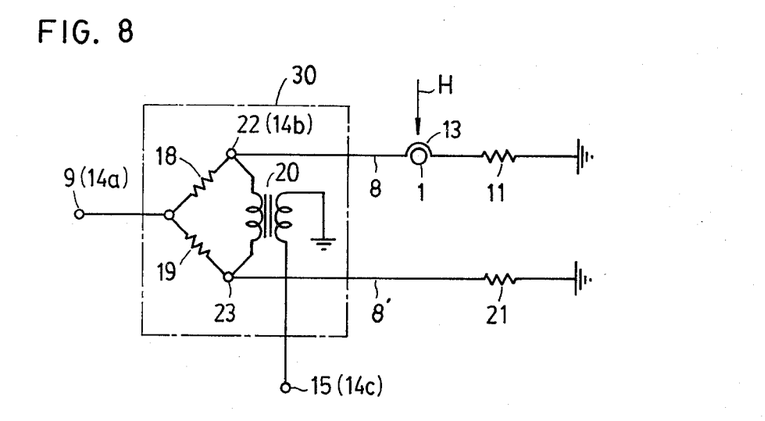
FIG. 8 is a circuit diagram illustrating another embodiment of the present invention which employs a directional bridge as the non-reversible circuit and a magnetic resonance as the resonance element.

FIG. 8 illustrates another embodiment of the present invention, which employs a directional bridge 30 as the non-reversible circuit. Resistors 18 and 19 are interconnected at one end of each and connected at the other ends to resistive terminating elements 11 and 21 via the signal paths 8 and 8', respectively, constituting a bridge 30. The magnetic resonance element 1 is coupled with the signal path 8 and a primary winding of a balance-to-unbalance transformer or the so-called balun 20, is connected between the connection points of the resistors 18, 19 and the signal paths 8, 8', a secondary winding of the balun 20 being connected to the output terminal 15. The common connection point of the resistors 18 and 19 is connected to the input terminal 9.

Let the resistance value of each of the resistors 11, 18, 19 and 21 be represented by the same value $R_0$. The resistance value $R_0$ and the characteristic impedance $Z_0$ of each of the signal paths 8 and 8' are selected equal to each other. The impedances observed toward the connection points 22 and 23 individually from the common connection point of the resistors 18 and 19 are each $2R_0$ and, on account of their parallel connection, the overall impedance of the bridge 30 as viewed from the common connection point of the resistors 18 and 19 is $R_0$, which is matched with the impedance of the signal path 8.

When a signal of a frequency apart from the resonance frequency of the magnetic resonance element 1 is applied to the input terminal 9, the bridge 30 balances, permitting no current to flow in the primary coil of the balun 20. Upon input of a signal having the same frequency as the resonance frequency of the magnetic resonance element, the signal is reflected by the magnetic resonance element 1 back to the connection point 22. In consequence, the bridge 30 becomes unbalanced by an amount corresponding to the reflected wave flowing between the connection points 22 and 23, and a current results from the reflected wave. The current is induced in the secondary winding of the balun 20 and derived at the output terminal 15. In this case, since the resistors 18 and 19 have flat frequency characteristics, the tuning device of this embodiment is capable of operating over a wide frequency range.

Figure 9:
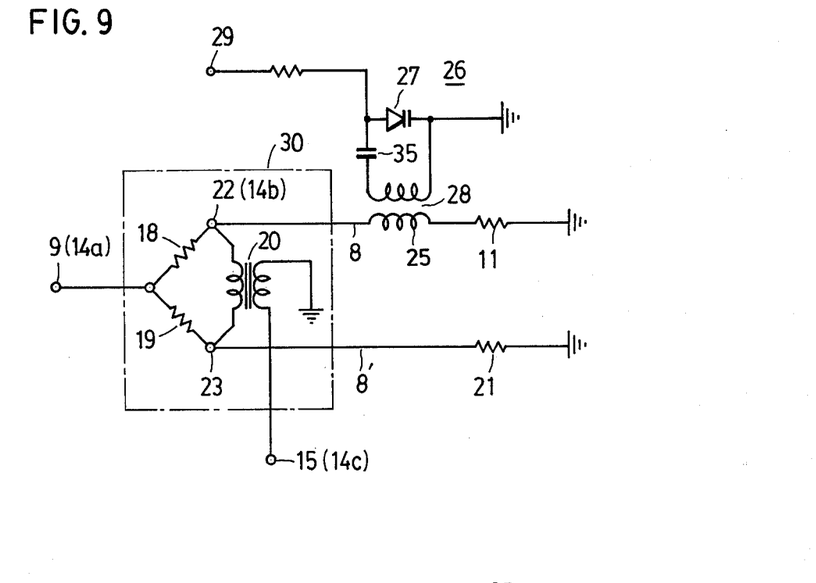
FIG. 9 is a circuit diagram illustrating another embodiment of the present invention which employs a directional bridge as the non-reversible circuit and a parallel resonance circuit as the resonance element.

In the case where the working frequency band is below 500 MHz, the resonance element is formed by a lumped constant circuit instead of the magnetic resonance element 1. FIG. 9 shows, by way of example, the circuit arrangement in such a case. In FIG. 9, the directional bridge 30 is used as the non-reversible circuit as is the case with FIG. 8 and a coil 25, which has a small impedance sufficiently negligible as compared with the resistance value $R_0$ of the resistor 11, is inserted in series with the signal path 8 connected to the port 14b. With the coil 25 is electromagnetically coupled a parallel resonance circuit 26 serving as a resonance element. The parallel resonance circuit 26 is formed, for instance, by a parallel circuit of a varactor diode 27 and a coil 28. The varactor diode 27 is connected by a DC control signal from a terminal 29, by which the resonance frequency of the resonance circuit 26 is varied. A DC blocking capacitor 35 is connected in series with the coil 28.

With the arrangement of FIG. 9, when signals of frequencies other than the resonance frequency of the resonance circuit 26 are applied, the bridge 30 balances to permit no current flow to the primary winding of the balun 20, yielding no signals at the output terminal 15.

In the case of input of a signal having the same frequency as the resonance frequency of the resonance circuit 26, the impedance on the side of the connection point 22 as viewed from the connection point of the resistors 18 and 19 is reduced by the resonance of the resonance circuit 26 as compared with the impedance on the side of the connection point 23. As a result, the bridge 30 becomes unbalanced, passing on the input signal to the output terminal 15.

According to the variable tuning device of this example, the insertion loss between the input terminal 9 and the output terminal is dependent upon the energy absorption ratio of the resonance circuit 26. That is, when the resonance circuit 26 absorbs the energy of a signal flowing in the signal path 8, all the absorbed energy is reflected back to the connection point 22 and derived at the output terminal 15. For example, assuming that the resonance impedance of the resonance circuit 26 has become 1/100 of the resistance value $R_0$ of the resistive terminating element 11, an electric power which is $4/102^2$ (about 0.04%) that of the input signal is supplied to the resistive terminating element 11. Therefore, the electric power of the input signal is mostly absorbed by the resonance circuit 26 and reflected back to the input side and provided to the output terminal 15. On the other hand, even if the resonance impedance of the resonance circuit 26 becomes approximately 1/10 the resistance value $R_0$ of the resistive terminating element 11, the electric power appearing in the resistive terminating element 11 is 2.7% or so and also all the electric power of the input signal, 97.3% (0.12 dB in terms of loss), is reflected and derived at the output terminal 15.

In accordance with the embodiment of FIG. 9, even if the resonance intensity of the resonance circuit 26 varies, that is, even if its resonance impedance scatters and even if the resonance impedance drops at both ends of a variable range, the reflected energy undergoes no substantial variations, so that a flat insertion loss can be obtained over a wide frequency band and, in addition, no appreciable dispersion is introduced in the resonance characteristic according to the resonance circuit 26 used. Moreover, since the output is yielded in proportion to the reflected energy, the insertion loss can be diminished.

Figure 10:
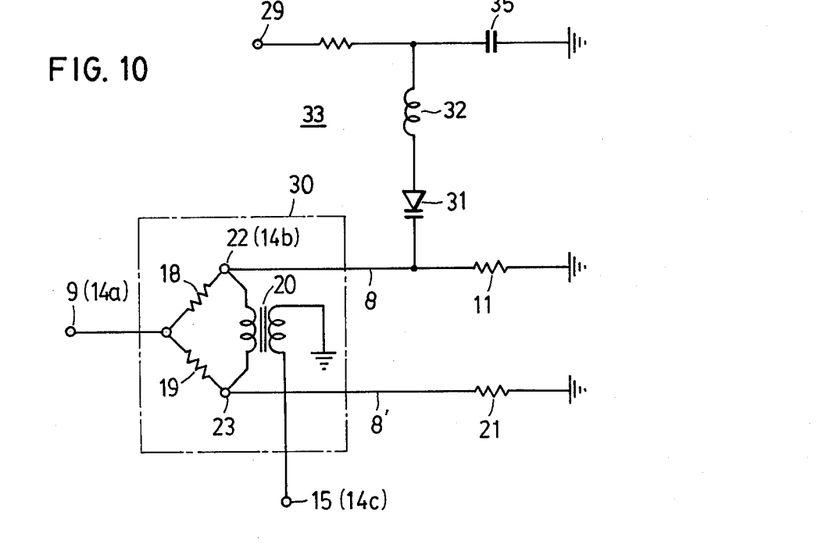
FIG. 10 is a circuit diagram illustrating another embodiment of the present invention which employs a directional bridge as the non-reversible circuit and a lumped constant type series resonance circuit as the resonance element.
Figure 11:
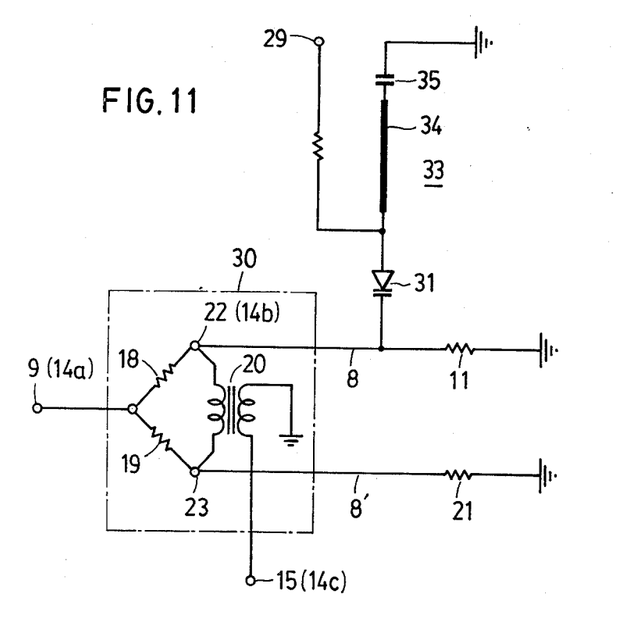
FIG. 11 is a circuit diagram illustrating another embodiment of the present invention which employs a directional bridge as the non-reversible circuit and a distributed constant type series resonance circuit as the resonance element.

FIGS. 10 and 11 illustrate modified forms of the embodiment of FIG. 9, in which a series resonance circuit is connected, as the resonance element, to the signal path 8. In the example of FIG. 10, a series resonance circuit 33, composed of a coupling capacitor 31 of a small capacitance value and a coil 32 connected in series therewith, is connected directly to the signal path 8 and the bridge 30 is made unbalanced by the resonance frequency of the series resonance circuit. The resonance frequency of the series resonance circuit 33 is varied using, for example, a varactor diode as the coupling capacitor 31. This arrangement is applied to a variable tuning device of higher frequencies than in the case of FIG. 9. The device of this arrangement is suitable for operation at hundreds of megahertzs; the device of FIG. 9 is suitable for operation at tens of megahertzs; the devices of FIGS. 3 to 8 are suitable for use at frequencies higher than 500 MHz; and the device of FIG. 11 is suitable for use at around 1000 MHz. In the embodiment of FIG. 11, a λ/4 line 34 is coupled with the signal path 8 via the coupling capacitor 31 and the λ/4 line 34 forming the series resonance circuit 33.

In the embodiments shown in FIGS. 9 to 11, the impedance characteristic is designed without regard to the resonance circuit 26 or 33 and the resonance circuit 26 or 33 is coupled with the signal path 8 through an impedance which is negligibly small with respect to the impedance characteristic. Thus, by setting the impedance characteristic in a wide frequency range in the state in which the resonance circuit 26 or 33 is not coupled with the signal path 8, the resonance frequency can be varied over a wide frequency band and the insertion loss in this case can easily be made flat over a wide band.

In the embodiments of FIGS. 8 to 11, the signal path 8' may be dispensed with. But the magnetic resonance element 1 and the parallel resonance circuit 26 are provided between the second port 14b of the non-reversible circuit and the resistive terminating element 11.

It will be apparent that many modifications and variations may be effected without departing from the scope of the novel concepts of this invention.

What is claimed is:

1. A variable tuning device for selecting a signal of a desired frequency component from an input signal, comprising:
   a non-reversible circuit including a three-port circulator, having first, second and third ports respectively arranged in the direction of circulation of said circulator, wherein said input signal is applied at said first port, a signal corresponding to said input signal is provided from said first port to said second port;
   a resistive terminating element connected via a signal path to the second port; and
   a magnetic resonance element coupled with said signal path and having a variable resonance frequency,
   wherein the third port is supplied from the second port with said signal of a desired frequency component in correspondence to the resonance frequency of the resonance element.

2. A variable tuning device according to claim 1 which has cascade-connected thereto a variable tuning device of the same construction.

3. A variable tuning device according to claim 1 wherein the circulator is a variable bias type circulator having a variable working frequency depending on the magnitude of a bias magnetic field applied thereto.

4. The device of claim 3, wherein the resonance element is a magnetic resonance element, comprising means for varying simultaneously the resonance frequency thereof and the working frequency of the circulator.

5. A variable tuning device for selecting a signal of a desired frequency component from an input signal, comprising
   a non-reversible circuit having a first, second and third ports, wherein said input signal is applied at said first port, a signal corresponding to said input signal is provided from said first port to said second port, and the third port is supplied from the second port with said signal of a desired frequency component,
   a resistive terminating element connected via a signal path to the second port, and
   a resonance element electromagnetically coupled with said signal path and having a variable resonance frequency corresponding to said desired frequency component;
   wherein:
   the non-reversible circuit is a directional bridge in which two resistors are connected in common at respective first ends;
   the first port is led out from the common connection point of the two resistors;
   the second port is led out from the second end of a first one of the two resistors;
   a terminating resistor is connected to the second end of the second one of the two resistors;
   the primary side of a transformer is connected between the second ends of the two resistors; and
   the third port is led out from the secondary side of the transformer.

6. A variable tuning device according to claim 5, wherein the resonance element is a parallel resonance circuit with a selectively variable resonance frequency and the parallel resonance circuit is electromagnetically coupled with the signal path.

7. A variable tuning device according to claim 5, wherein the resonance element is a series resonance circuit with a selectively variable resonance frequency and the series resonance circuit is connected in parallel with the resistive terminating element.

8. A variable tuning device according to claim 7 wherein the series resonance circuit is formed by a lumped constant element.

9. A variable tuning device according to claim 7 wherein the series resonance circuit is composed of a distributed constant element and a lumped constant element.

10. A variable tuning device for selecting a signal of a desired frequency component from an input signal, comprising:
    a non-reversible circuit having first, second and third ports, wherein said input signal is applied at said first port, a signal corresponding to said input signal is provided from said first port to said second port, and the third port is supplied from the second port with said signal of a desired frequency component, a resistive terminating element connected via a signal path to the second port; and a resonance element electromagnetically coupled with said signal path and having a variable resonance frequency corresponding to said desired frequency component;

wherein the non-reversible circuit is a directional coupler with input, output and reflecting ports serving as the first, third and second ports, respectively.

11. The device of claim 1, 5, 3 or 10, said resonance frequency being selectively variable by varying the strength of a magnetic field applied to said resonance element.

12. The device of claims 1, 5 or 10, wherein the input impedance of said first port and the output impedance of said third port are independent of the resonance frequency of said resonance element.

* * * * *

UNITED STATES PATENT AND TRADEMARK OFFICE
CERTIFICATE OF CORRECTION

PATENT NO. : 4,460,879

DATED : July 17, 1984

INVENTOR(S) : Masaaki Hirose

It is certified that error appears in the above-identified patent and that said Letters Patent is hereby corrected as shown below:

Figures 9-11 should be added as per attach sheets.

(In the Grant only)

Signed and Sealed this

Seventeenth Day of September 1985

[SEAL]

Attest:

DONALD J. QUIGG

Attesting Officer

Commissioner of Patents and
Trademarks—Designate

UNITED STATES PATENT AND TRADEMARK OFFICE
CERTIFICATE OF CORRECTION

PATENT NO. : 4,460,879
DATED : July 17, 1984
INVENTOR(S) : MASAAKI HIROSE

It is certified that error appears in the above-identified patent and that said Letters Patent is hereby corrected as shown below:

Please insert Figs. 9-11 in the subject patent.

FIG. 9

FIG. 10

UNITED STATES PATENT AND TRADEMARK OFFICE
CERTIFICATE OF CORRECTION

PATENT NO. : 4,460,879

DATED : July 17, 1984

INVENTOR(S) : MASAAKI HIROSE

It is certified that error appears in the above-identified patent and that said Letters Patent is hereby corrected as shown below:

FIG. 11